(12) United States Patent
Murphy et al.

(10) Patent No.: US 7,531,377 B2
(45) Date of Patent: May 12, 2009

(54) OPTICAL DEVICE

(75) Inventors: Craig Edward Murphy, Cambridge (GB); Salvatore Cina, Rennes (FR); Timothy Butler, Cambridge (GB); Matthew Roberts, Cambridge (GB); Nalinkumar Lallubhai Patel, Cambridge (GB); Clare Louise Foden, Cambridge (GB); Mark Levence Leadbeater, Cambridge (GB); Daniel Alan Forsythe, Cambridge (GB); Robert Sidney Archer, Essex (GB); Nicholas de Brissac Baynes, Newmarket (GB); Nathan Luke Phillips, Cambridge (GB); Anil Raj Duggal, Niskayuna, NY (US); Jie Liu, Niskayuna, NY (US)

(73) Assignee: Cambridge Display Technology Limited, Cambridgeshire (GB)

( * ) Notice: Subject to any disclaimer, the term of this patent is extended or adjusted under 35 U.S.C. 154(b) by 108 days.

(21) Appl. No.: 10/526,804

(22) PCT Filed: Sep. 3, 2003

(86) PCT No.: PCT/GB03/03960
§ 371 (c)(1),
(2), (4) Date: Dec. 15, 2005

(87) PCT Pub. No.: WO2004/023573
PCT Pub. Date: Mar. 18, 2004

(65) Prior Publication Data
US 2006/0154384 A1      Jul. 13, 2006

Related U.S. Application Data

(60) Provisional application No. 60/480,502, filed on Jun. 20, 2003.

(30) Foreign Application Priority Data
Sep. 3, 2002    (GB) ................................ 0220404.8

(51) Int. Cl.
*H01L 21/00* (2006.01)

(52) U.S. Cl. .............................. 438/82; 438/99; 257/40; 313/504; 313/506; 428/690

(58) Field of Classification Search .................. 438/82, 438/99; 257/40; 313/504, 506, 512; 428/690, 428/917
See application file for complete search history.

(56) References Cited

U.S. PATENT DOCUMENTS 5,523,555 A       6/1996   Friend et al. ............ 250/214 R (Continued)

FOREIGN PATENT DOCUMENTS

EP              0 776 147 B1      5/1997

(Continued)

OTHER PUBLICATIONS

Wang et al., "Novel Light-Emitting Devices Based on Pyridine-Containing Conjugated Polymers," *IEEE Transactions on Electron Devices*, 44(8):1263-1268 (Aug. 1997).

(Continued)

*Primary Examiner*—Hsien-ming Lee
(74) *Attorney, Agent, or Firm*—Marshall, Gerstein & Borun LLP

(57) ABSTRACT

A method of forming an optical device comprising the steps of: providing a substrate comprising a first electrode capable of injecting or accepting charge carriers of a first type; forming over the first electrode a first layer that is at least partially insoluble in a solvent by depositing a first semiconducting material that is free of cross-linkable vinyl or ethynyl groups and is, at the time of deposition, soluble in the solvent; forming a second layer in contact with the first layer and comprising a second semiconducting material by depositing a second semiconducting material from a solution in the solvent; and forming over the second layer a second electrode capable of injecting or accepting charge carriers of a second type wherein the first layer is rendered at least partially insoluble by one or more of heat, vacuum and ambient drying treatment following deposition of the first semiconducting material.

19 Claims, 5 Drawing Sheets

U.S. PATENT DOCUMENTS

| | | | |
|---|---|---|---|
| 5,723,873 A | 3/1998 | Yang | 257/40 |
| 5,798,170 A | 8/1998 | Zhang et al. | 428/212 |
| 6,107,452 A | 8/2000 | Miller et al. | 528/422 |
| 6,268,695 B1 | 7/2001 | Affinito | 313/504 |
| 6,353,083 B1 | 3/2002 | Inbasekaran et al. | 528/295 |
| 6,517,958 B1 * | 2/2003 | Sellinger et al. | 428/690 |

FOREIGN PATENT DOCUMENTS

| | | |
|---|---|---|
| EP | 0 842 208 B1 | 5/1998 |
| EP | 0 851 714 A2 | 7/1998 |
| EP | 0 880 303 B1 | 11/1998 |
| EP | 0 901 176 B1 | 3/1999 |
| EP | 0 949 850 B1 | 10/1999 |
| EP | 1 030 383 A2 | 8/2000 |
| EP | 1 093 166 A2 | 4/2001 |
| EP | 1 225 472 A2 | 7/2002 |
| GB | 1 182 583 | 2/1970 |
| GB | 2 346 316 A | 8/2000 |
| WO | WO 90/13148 | 11/1990 |
| WO | WO 94/03030 | 2/1994 |
| WO | WO 96/16449 | 5/1996 |
| WO | WO 97/32452 | 9/1997 |
| WO | WO 98/05187 | 2/1998 |
| WO | WO 98/10621 | 3/1998 |
| WO | WO 99/12398 | 3/1999 |
| WO | WO 99/48160 | 9/1999 |
| WO | WO 99/54385 | 10/1999 |
| WO | WO 00/46321 | 8/2000 |
| WO | WO 00/48258 | 8/2000 |
| WO | WO 00/53656 | 9/2000 |
| WO | WO 00/55927 | 9/2000 |
| WO | WO 01/19142 A1 | 3/2001 |
| WO | WO 01/49768 | 7/2001 |
| WO | WO 01/62869 A1 | 8/2001 |
| WO | WO 01/81649 A1 | 11/2001 |
| WO | WO 03/012891 A1 | 2/2003 |

OTHER PUBLICATIONS

Bernius et al., "Progress with Light-Emitting Polymers," *Adv. Mater.*, 12(23):737-1750 (Dec. 2000).

Kim et al., "Synthesis and Properties of Novel Triphenylamine Polymers Containing Ethynyl and Aromatic Moieties," *Synthetic Metals*, 122:363-368 (2001).

Liu et al., "Effects of Thermal Annealing on the Performance of Polymer Light Emitting Diodes," *J. Applied Physics*, 91(3):1595-1600 (Feb. 2002).

Duggal et al., "Organic Light-Emitting Devices for Illumination Quality White Light," *Appl. Physics Letters*, 80(19):3470-3472 (May 2002).

International Search Report for PCT/GB2003/03960, dated Jul. 20, 2004.

Combined Search and Examination Report for Appl. No. GB 0220404.8, dated Apr. 10, 2003.

* cited by examiner

OPTICAL DEVICE

This is the U.S. national phase of International Application No. PCT/GB2003/003960 filed Sep. 3, 2003, which claims the benefit under 35 U.S.C. § 119(e) of U.S. Provisional Application Ser. No. 60/480,502 filed Jun. 20, 2003, the full disclosures of which are hereby incorporated by reference.

FIELD OF THE INVENTION

This invention relates to organic optical devices comprising a layer of insoluble organic material and methods for the production thereof.

BACKGROUND OF THE INVENTION

Electroactive polymers are now frequently used in a number of optical devices such as in polymeric light emitting diodes ("PLEDs") as disclosed in WO 90/13148, photovoltaic devices as disclosed in WO 96/16449 and photodetectors as disclosed in U.S. Pat. No. 5,523,555.

A typical PLED comprises a substrate, on which is supported an anode, a cathode and an organic electroluminescent layer between the anode and cathode comprising at least one polymeric electroluminescent material. In operation, holes are injected into the device through the anode and electrons are injected into the device through the cathode. The holes and electrons combine in the organic electroluminescent layer to form an exciton which then undergoes radiative decay to give light. Other layers may be present in the PLED, for example a layer of organic hole injection material such as poly(ethylene dioxy thiophene)/polystyrene sulfonate (PEDT/PSS) may be provided between the anode and the organic electroluminescent layer to assist injection of holes from the anode to the organic electroluminescent layer.

In a typical PLED, the electroluminescent material is provided as a single layer as described in, for example, WO 99/48160 which comprises a blend of a hole transporting polymer, an electron transporting polymer and an emissive polymer. Alternatively, a single polymer may provide two or more of the functions of hole transport, electron transport and emission. The electroluminescent polymer or polymers are preferably soluble in common organic solvents to facilitate their deposition. One such class of soluble polymers are polyfluorenes which have good film forming properties and which may be readily formed by Suzuki or Yamamoto polymerisation which enables a high degree of control over the regioregularity of the resultant polymer.

It may, however, be preferred to cast multiple layers, i.e., laminates, of different polymers on a single substrate surface, so that one can achieve optimisation of separate functions, for example electron or hole charge transport, luminescence, photo-induced charge generation, and charge blocking or storage. Furthermore, it is believed that PEDT/PSS may have a deleterious effect on the electroluminescent layer, for example by ingress of protons or sulfonate groups from PSS into the electroluminescent layer (i.e. the layer in which holes and electrons combine to form an exciton), resulting in quenching of luminescence. Accordingly, it may be desirable to provide a protective layer between PEDT/PSS and the electroluminescent layer. However, preparation of polymer laminates can be problematic due to solubility of initially cast or deposited layers in the solvents used for succeeding layers.

Layers of electroluminescent polymer may be formed by depositing a soluble polymeric precursor which is then chemically converted to an insoluble, electroluminescent form. For example, WO 94/03030 discloses a method wherein insoluble, electroluminescent poly(phenylene vinylene) is formed from a soluble precursor and further layers are then deposited from solution onto this insoluble layer. However, the chemical conversion process involves extreme processing conditions and reactive by-products that may harm the performance of the finished device. Accordingly, electroluminescent polymers that are soluble in common organic solvents are preferable. Examples of such materials are disclosed in, for example, Adv. Mater. 2000 12(23) 1737-1750 and include polymers with fully or at least partially conjugated backbones such as polyfluorenes, polyphenylenes and poly(arylene vinylenes) with solubilising groups, and polymers with non-conjugated backbones such as poly(vinyl carbazole).

WO 98/05187 discloses a method of forming a multilayer device comprising the steps of depositing a poly(vinyl pyridine) layer onto PEDT/PSS and depositing a PPV precursor onto the poly(vinyl pyridine) layer. As above, this precursor requires harsh processing conditions in order to convert to a semiconducting material.

U.S. Pat. No. 6,107,452 discloses a method of forming a multilayer device wherein fluorene containing oligomers comprising terminal vinyl groups are deposited from solution and cross-linked to form insoluble polymers onto which additional layers may be deposited. Similarly, Kim et al, Synthetic Metals 122 (2001), 363-368 discloses polymers comprising triarylamine groups and ethynyl groups which may be cross-linked following deposition of the polymer. The choice of polymers in both instances is constrained by the requirement that a plurality of vinyl or ethynyl moieties be present.

IEEE Transactions on Electron Devices, 44(8), 1263-1268, 1997 discloses the formation of a bilayer of poly(vinyl carbazole) PVK and a pyridine-containing conjugated polymer. This is possible because the solvent used to deposit the pyridine-containing conjugated polymer does not dissolve the underlying layer of PVK.

J. Liu, Z. F. Guo and Y. Yang, J. Appl Phys. 91, 1595-1600, 2002, discloses forming a multilayer device by depositing and heating a semiconducting polymer and then depositing another layer of the same polymer.

WO 99/48160 discloses PLEDs wherein a layer of hole transport material is provided between a layer of PEDT/PSS and a layer of electroluminescent material.

Although much effort has been devoted to the fabrication of multilayered polymeric optical devices, including PLEDs, there still exists a continued need to provide multilayered polymeric optical devices having improved performance, and methods to produce such devices.

SUMMARY OF THE INVENTION

In a first aspect, the invention provides a method of forming an optical device comprising the steps of:
  providing a substrate comprising a first electrode capable of injecting or accepting charge carriers of a first type;
  forming over the first electrode a first layer that is at least partially insoluble in a solvent by depositing a first semiconducting material that is free of cross-linkable vinyl or ethynyl groups and is, at the time of deposition, soluble in the solvent;
  forming a second layer in contact with the first layer and comprising a second semiconducting material by depositing a second semiconducting material from a solution in the solvent; and
  forming over the second layer a second electrode capable of injecting or accepting charge carriers of a second type wherein the first layer is rendered at least partially insoluble by one or more of heat, vacuum and ambient drying treatment following deposition of the first semiconducting material.

Preferably, at least one of the first and second semiconducting materials is a polymer. More preferably, both the first and second semiconducting materials are polymers.

Preferably, the method comprises the step of heating the first layer prior to formation of the second layer. More preferably, the first layer is heated at above the glass transition temperature of the first semiconducting material.

"Ambient drying treatment" as used herein means treatment not involving heat or vacuum allowing solvent to evaporate from the first layer. In particular, ambient drying treatment may entail allowing evaporation of solvent from the first layer under ambient conditions, optionally in the presence of a stream of inert gas.

Preferably, the method comprises a step prior to forming the second layer of washing the first layer with a washing solvent in which the first semiconducting material is soluble.

Preferably, the first layer is deposited from a solution in the solvent.

Preferably, the solvent is an aromatic hydrocarbon, more preferably an alkylated benzene and most preferably toluene or xylene.

Preferably, the first semiconducting material is free of cross-linkable groups other than vinyl or ethynyl groups.

Where one or both of the first and second semiconducting materials are polymers, it is preferred that repeat units of the first and second semiconducting polymers are conjugated to adjacent repeat units to form an at least partially conjugated polymer backbone.

Such polymers preferably comprise 9-substituted or 9,9-disubstituted fluorene-2,7-diyl repeat units, most preferably optionally substituted units of formula (I):

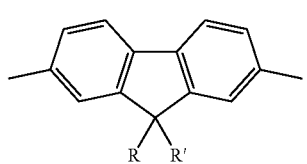

(I)

wherein R and R' are independently selected from hydrogen or optionally substituted alkyl, alkoxy, aryl, arylalkyl, heteroaryl and heteroarylalkyl, and at least one of R and R' is not hydrogen. More preferably, at least one of R and R' comprises an optionally substituted $C_4$-$C_{20}$ alkyl group.

In a first preferred embodiment of the device prepared by the method of the invention, the first electrode is capable of injecting or accepting holes and the second electrode is capable of injecting or accepting electrons. In this embodiment, a layer of conductive organic material is preferably provided between the first electrode and the first layer. The conductive organic material typically comprises a charged species, in particular a charged polymer, with a charge balancing dopant. Examples of conductive polymers are PEDT with a charge balancing polyacid or the conductive form of polyaniline. Preferably, the layer of conductive organic material is PEDT/PSS In this embodiment, the first semiconducting material preferably comprises a hole transporting material, more preferably a polymer comprising triarylamine repeat units. Particularly preferred triarylamine repeat units are selected from optionally substituted repeat units of formulae 1-6:

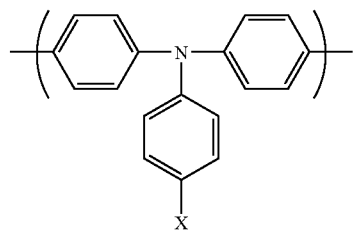

1

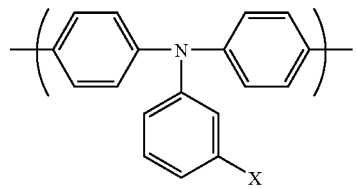

2

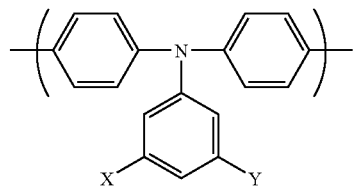

3

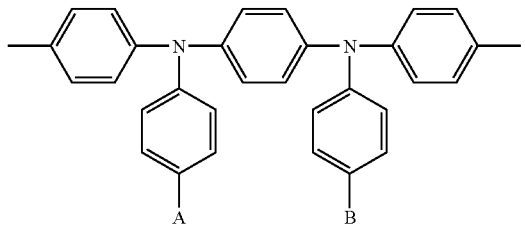

4

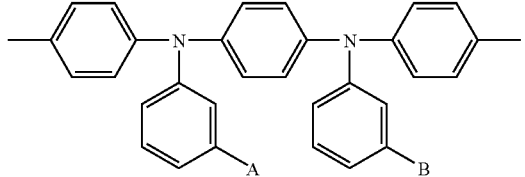

5

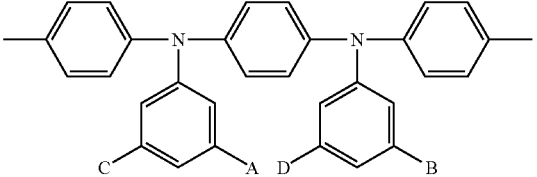

6 wherein X, Y, A, B, C and D are independently selected from H or a substituent group. More preferably, one or more of X, Y, A, B, C and D is independently selected from the group consisting of alkyl, aryl, perfluoroalkyl, thioalkyl, cyano, alkoxy, heteroaryl, alkylaryl and arylalkyl groups.

Also particularly preferred as the triarylamine repeat unit is an optionally substituted repeat unit of formula 7:

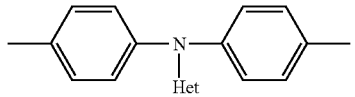

wherein Het is a heteroaryl. Most preferably, Het is 4-pyridyl.

Preferably, the first semiconducting material comprises a 1:1 regular, alternating copolymer of a fluorene repeat unit and a triarylamine repeat unit.

In a second preferred embodiment of the device prepared by the method of the invention, the first electrode is capable of injecting or accepting electrons and the second electrode is capable of injecting or accepting holes. In this embodiment, the first semiconducting material preferably comprises an electron transporting material, preferably the homopolymer of an optionally substituted 9,9-dialkylfluorene-2,7-diyl.

Preferably, the first layer has a thickness of less than 20 nm, more preferably less than 10 nm, most preferably in the range 3-10 nm.

Preferably, the second semiconducting polymer comprises a plurality of regions and comprising at least two of a hole transporting region, an electron transporting region and an emissive region, more preferably all three of these regions.

In a second aspect, the invention provides an optical device preparable according to the method of the invention. Preferably, the optical device is an electroluminescent device, more particularly a blue light emitting electroluminescent device. A part of the emission of the blue light emitting device may be downconverted with phosphors capable of producing red and green light by downconverting said blue light to give a white light emitting electroluminescent device.

The method of the invention enables the formation of polymer laminates wherein the first layer is particularly thin. Accordingly, in a third aspect, the invention provides an optical device comprising, in sequence:
  a substrate
  a first electrode capable of injecting or accepting charge carriers of a first type
  a first layer having a thickness less than 20 nm comprising a first semiconducting polymer that is insoluble in a solvent
  a second layer in contact with the first layer comprising a second semiconducting polymer that is soluble in the solvent
  a second electrode capable of injecting or accepting charge carriers of a second type.

In a fourth aspect, the invention provides a method of forming an optical device comprising the steps of:
  providing a substrate carrying a conductive organic material capable of injecting or accepting holes and capable of donating protons;
  forming over and in contact with the conductive organic material a first layer by depositing a first semiconducting polymer capable of accepting protons wherein the semiconducting polymer is, at the time of deposition, soluble in a solvent;
  subjecting the first layer to one or more of heat, vacuum or ambient drying treatment treatment;
  forming a second layer by depositing over, and in contact with, the first layer a second semiconducting polymer from a solution in the solvent; and
  forming over the second layer a second electrode capable of injecting or accepting electrons.

Preferably, the first semiconducting polymer comprises triarylamine repeat units. More preferably, the triarylamine repeat units are selected from repeat units 1-7 described above.

Preferably, the first semiconducting polymer comprises a 1:1 regular, alternating copolymer of a fluorene repeat unit and a triarylamine repeat unit.

Preferably, a layer of inorganic material capable of injecting or accepting holes is provided between the substrate and the conductive organic material. Most preferably, the inorganic material capable of injecting or accepting holes is indium tin oxide.

Preferably, the conductive organic material is PEDT/PSS.

In a fifth aspect, the invention provides a method of forming an optical device comprising the steps of:
  providing a substrate comprising a first electrode capable of injecting or accepting charge carriers of a first type;
  forming over the first electrode a first layer that is at least partially insoluble in a solvent by depositing a first semiconducting material that is free of cross-linkable vinyl or ethynyl groups;
  subjecting the first layer to heat treatment;
  forming a second layer in contact with the first layer and comprising a second semiconducting material by depositing a second semiconducting material from a solution in the solvent; and
  forming over the second layer a second electrode capable of injecting or accepting charge carriers of a second type.

Preferably, at least one, and more preferably both, of the first and second semiconducting materials according to this fifth aspect of the invention are polymers.

The first semiconducting material according to this fifth aspect may or may not be soluble in the solvent used for deposition of the second semiconducting polymer.

In a sixth aspect, the invention provides a method of forming an optical device comprising the steps of:
  providing a substrate comprising a first electrode capable of injecting or accepting charge carriers of a first type;
  forming a first layer over the first electrode by depositing a first semiconducting polymer comprising fluorene repeat units, the first semiconducting polymer being free of cross-linkable vinyl or ethynyl groups and being, at the time of deposition, soluble in the solvent;
  subjecting the first layer to one or more of heat, vacuum or ambient drying treatment treatment;
  forming a second layer in contact with the first layer and comprising a second semiconducting polymer by depositing a second semiconducting polymer from a solution in the solvent; and
  forming over the second layer a second electrode capable of injecting or accepting charge carriers of a second type.

The first and second semiconducting polymers according to any aspect of the invention are different. For example, the first and second polymers may differ in the molecular weights of the two polymers. Alternatively, or in addition, the first and second polymers may differ in the regioregularity of repeat units within the polymer. Most preferably, the first and second polymers differ in that one of the first and second polymers comprises at least one form of repeat unit not present in the other polymer. Thus, for example, the first polymer when deposited may form a hole transport layer and the second polymer when deposited may form an electroluminescent layer by virtue of differences between the first and second polymer in terms of regioregularity and/or chemical identity of repeat units. The second layer may consist solely of the second semiconducting polymer or it may be a blend comprising the second semiconducting polymer.

By "red light" is meant radiation having a wavelength in the range of 600-750 nm, preferably 600-700 nm, more preferably 610-650 nm and most preferably having an emission peak around 650-660 nm.

By "green light" is meant radiation having a wavelength in the range of 510-580 nm, preferably 510-570 nm.

By "blue organic light" is meant radiation having a wavelength in the range of 400-500 nm, more preferably 430-500 nm.

The meaning of "hole transporting", "electron transporting" and "emissive" as used herein is explained in, for example, WO 00/55927 and WO 00/46321 and as such will be apparent to the skilled person.

BRIEF DESCRIPTION OF THE DRAWINGS

The present invention will now be described in further detail, by way of example only, with reference to the accompanying drawings in which.

DETAILED DESCRIPTION OF THE INVENTION

Figure 1:
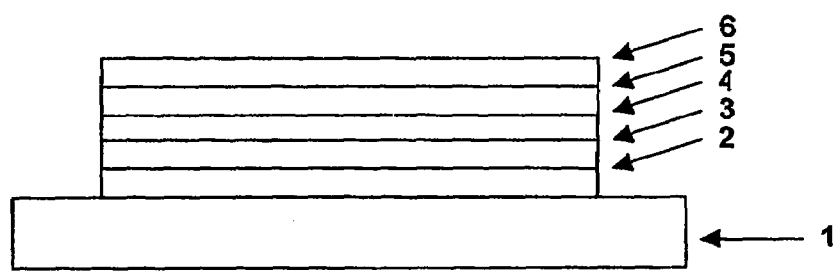
FIG. 1 shows a PLED or photovoltaic device prepared according to the method of the invention.

With reference to FIG. 1, a PLED or photovoltaic device prepared according to the method of the invention comprises a substrate 1, an anode 2 of indium tin oxide, a layer 3 of organic hole transport material, a layer 4 of insoluble material made by deposition of a first soluble semiconducting polymer, a layer 5 made by deposition of a second semiconducting polymer and a cathode 6.

Optical devices tend to be sensitive to moisture and oxygen. Accordingly, the substrate preferably has good barrier properties for prevention of ingress of moisture and oxygen into the device. The substrate is commonly glass, however alternative substrates may be used, in particular where flexibility of the device is desirable. For example, the substrate may comprise a plastic as in U.S. Pat. No. 6,268,695 which discloses a substrate of alternating plastic and barrier layers or a laminate of thin glass and plastic as disclosed in EP 0949850.

Although not essential, the presence of layer 3 of organic hole injection material is desirable as it assists hole injection from the anode into the layer or layers of semiconducting polymer. Examples of organic hole injection materials include PEDT/PSS as disclosed in EP 0901176 and EP 0947123, or polyaniline as disclosed in U.S. Pat. No. 5,723,873 and U.S. Pat. No. 5,798,170.

Cathode 6 is selected in order that electrons are efficiently injected into the device and as such may comprise a single conductive material such as a layer of aluminium. Alternatively, it may comprise a plurality of metals, for example a bilayer of calcium and aluminium as disclosed in WO 98/10621, or a thin layer of dielectric material such as lithium fluoride to assist electron injection as disclosed in, for example, WO 00/48258.

The device is preferably encapsulated with an encapsulant (not shown) to prevent ingress of moisture and oxygen. Suitable encapsulants include a sheet of glass, films having suitable barrier properties such as alternating stacks of polymer and dielectric as disclosed in, for example, WO 01/81649 or an airtight container as disclosed in, for example, WO 01/19142.

In a practical device, at least one of the electrodes is semitransparent in order that light may be absorbed (in the case of a photoresponsive device) or emitted (in the case of a PLED). Where the anode is transparent, it typically comprises indium tin oxide. Examples of transparent cathodes are disclosed in, for example, GB 2348316.

Insoluble layer 4 preferably comprises a polymer comprising fluorene repeat units. Where the insoluble layer is located between the anode and layer 5, as per the embodiment of FIG. 1, it is preferably formed from a semiconducting polymer capable of transporting holes—for example a copolymer of a fluorene repeat unit and a triarylamine repeat unit as disclosed in WO 99/54385. Alternatively, the insoluble layer may be deposited over a cathode. In this instance, the insoluble layer is preferably formed from a semiconducting polymer capable of transporting electrons—for example a homopolymer of fluorene as disclosed in, for example, EP 0842208.

Insoluble layer 4 is formed upon deposition of the first semiconducting polymer. The layer as deposited may be entirely insoluble or partially insoluble. Where the first layer is only partially insoluble, the insoluble fraction within the layer may be increased by heating of the layer as deposited. Any soluble first semiconducting polymer may be removed from the layer by rinsing in an appropriate solvent in order to leave an entirely insoluble layer.

The second semiconducting polymer according to the invention used to form layer 5 may be any semiconducting polymer that is soluble in the same solvent as the first semiconducting polymer used to form insoluble layer 4. Examples of suitable second semiconducting polymers include soluble poly(p-phenylene vinylenes), polyphenylenes and polyfluorenes as disclosed in Adv. Mater. 2000 12(23) 1737-1750 and references therein. A single polymer or a plurality of polymers may be deposited from solution to form layer 5. Where a plurality of polymers are deposited, they preferably comprise a blend of at least two of a hole transporting polymer, an electron transporting polymer and, where the device is a PLED, an emissive polymer as disclosed in WO 99/48160. Alternatively, layer 5 may be formed from a single second semiconducting polymer that comprises regions selected from two or more of hole transporting regions, electron transporting regions and emissive regions as disclosed in, for example, WO 00/55927 and U.S. Pat. No. 6,353,083. Each of the functions of hole transport, electron transport and emission may be provided by separate polymers or separate regions of a single polymer. Alternatively, more than one function may be performed by a single region or polymer. In particular, a single polymer or region may be capable of both charge transport and emission. Each region may comprise a single repeat unit, e.g. a triarylamine repeat unit may be a hole transporting region. Alternatively, each region may be a chain of repeat units, such as a chain of polyfluorene units as an electron transporting region. The different regions within such a polymer may be provided along the polymer backbone, as per U.S. Pat. No. 6,353,083, or as groups pendant from the polymer backbone as per WO 01/62869. Where insoluble layer 4 possesses hole or electron transporting property, a polymer or polymer region having this property may optionally be excluded from the polymer or polymers comprising layer 5.

The first and second polymers according to the invention are both semiconducting. The backbone of either polymer may or may not be at least partially conjugated. Examples of semiconducting polymers with an at least partially conjugated backbone include polyarylenes, such as polyfluorenes and polyphenylenes, and poly(arylene vinylenes) as described above. The invention also encompasses first and second semiconducting polymers not having a conjugated backbone, for example poly(vinylcarbazole).

The optical device prepared according to the method of the invention is preferably a PLED when the first and second electrodes inject charge carriers. In this case, layer 5 is a light emitting layer.

The optical device is preferably a photovoltaic device or photodetector when the first and second electrodes accept charge carriers. In this case, the second layer preferably comprises a polymer or polymers capable of hole and electron transport.

The present inventors have surprisingly found that the performance of a polymeric optical device may be improved if it is prepared by providing multiple layers of semiconducting polymer. To prevent any substantial mixing of the first layer and second layer, the present inventors have surprisingly found that suitable treatment of the first layer, in particular heat treatment, renders the first layer insoluble.

The inventors have surprisingly found that semiconducting polymers comprising fluorene repeat units without cross-linking (e.g. vinyl or ethynyl) moieties, become partially insoluble when deposited to form insoluble layer 4. The present inventors have found that this insoluble layer forms (a) regardless of whether a PEDT/PSS layer is used or not and (b) in air or in a nitrogen only environment. However, the present inventors have found that it is necessary to subject this insoluble layer to heat, vacuum or ambient drying treatment following deposition of the polyfluorene in order to maximise device performance, and in particular to minimise mixing of the second layer with the first layer by increasing the insolubility of the first layer. Without wishing to be bound by any theory, possible mechanisms for loss of solubility upon formation of the first layer include loss of solubilising groups attached to the 9-position of fluorene repeat units within the first semiconducting polymer or an adhesion to the surface that the first semiconducting polymer is deposited onto following elimination of solvent from the polymer.

The present inventors have also found that other semiconducting polymers, for example poly(vinyl carbazole) (PVK) can also form an insoluble layer under conditions according to the invention.

As outlined above, layer 4 is resistant to dissolution in the solvent used for deposition of layer 5 under the conditions typically employed for polymer deposition and solvent evaporation as used in the method of the present invention. Furthermore, layer 4 has been found to be resistant to dissolution when rinsed with said solvent. Although dissolution of layer 4 may be possible in said solvent under forcing conditions, it will be appreciated that layer 4 is sufficiently insoluble to enable formation of a plurality of electroactive organic layers in accordance with the method of the invention and under the conditions typically employed for deposition of a semiconducting polymer in said solvent. The term "insoluble" should therefore be construed accordingly.

The described treatment has been found to improve efficiency and lifetime of PLEDs. Without wishing to be bound by any theory, the following factors may contribute to these observed increases:

The first layer may act as a hole transporting, electron blocking layer when located between the anode and the second layer.

Where a PEDT/PSS layer is used, the insoluble layer may be preventing ingress of protons from the acidic PSS material into the second layer. This may apply in particular where the polymer comprises basic units such as amines of formulae 1-6 or Het groups within the scope of formula 7, such as pyridyl, that are capable of accepting protons.

The thinness of the layer, which is achieved in particular when the spin-rinsing step is employed, may enable charge blocking without any detriment to device performance that may result from a thicker layer, such as higher drive voltage.

EXAMPLES

General Procedure

The invention is exemplified here using the polymer "F8-TFB", illustrated below and disclosed in WO 99/54385, as the first semiconducting polymer.

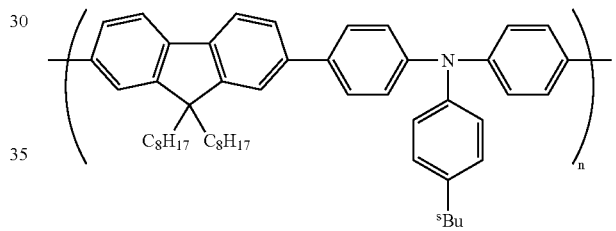

F8-TFB

The general procedure follows the steps outlined below:

1) Depositing PEDT/PSS, available from Bayer® as Baytron P® onto indium tin oxide supported on a glass substrate (available from Applied Films, Colorado, USA) by spin coating.

2) Depositing a layer of hole transporting polymer by spin coating from xylene solution having a concentration of 2% w/v.

3) Heating the layer of hole transport material in an inert (nitrogen) environment.

4) Optionally spin-rinsing the substrate in xylene to remove any remaining soluble hole transport material.

5) Depositing the second semiconducting polymer by spin-coating from xylene solution.

6) Depositing a NaF/Al cathode over the second semiconducting polymer in accordance with the process described in WO 03/012891 and encapsulation of the device using an airtight metal enclosure available from Saes Getters SpA.

Parameters within this general process may be varied. In particular: the concentration of F8-TFB may be up to around 3% w/v and a concentration of 0.5% w/v may be used to provide a particularly thin film; the optional heating step may last for any length of time up to around 2 hours; and the optional heating step may be at any temperature up to around 220° C., but preferably above the glass transition temperature of the deposited polymer. As will be apparent to the skilled person, first and/or second polymers, and other device components such as PEDT/PSS, will be subject to thermal degradation if the heating temperature is excessive, and the heating temperature should be selected accordingly. Finally, the present inventors have found that the thickness of the first layer may be modified by appropriate selection of molecular weight (Mw) of the first semiconducting polymer. Thus, F8-TFB having a Mw of 50,000 may give a thickness as low as about 2 nm, but up to about 15 nm for Mw of around 250,000-300,000.

Example 1

The general procedure above was followed using F8-TFB as the first semiconducting polymer and a blue electroluminescent polymer comprising 70% 9,9-dioctylfluorene-2,7-diyl, 10% 9,9-diphenylfluorene-2,7-diyl, 10% "TFB" repeat unit and 10% "PFB" repeat unit as the second semiconducting polymer (F8-TFB polymer, TFB and PFB repeat units are illustrated below and are described in, for example, WO 99/54385). The first and second semiconducting polymers were prepared by Suzuki polymerisation as disclosed in, for example, WO 00/53656.

The first semiconducting layer of F8-TFB was subjected to heat treatment at 180° C. for 1 hour prior to deposition of the second semiconducting polymer.

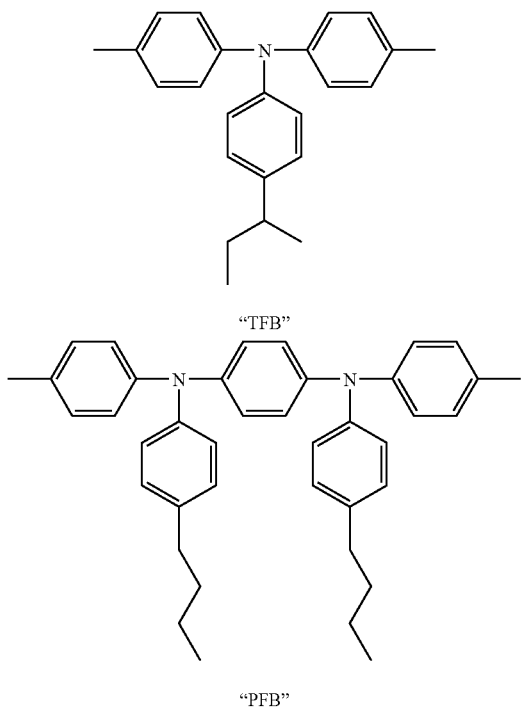

"TFB"

"PFB"

Figure 2:
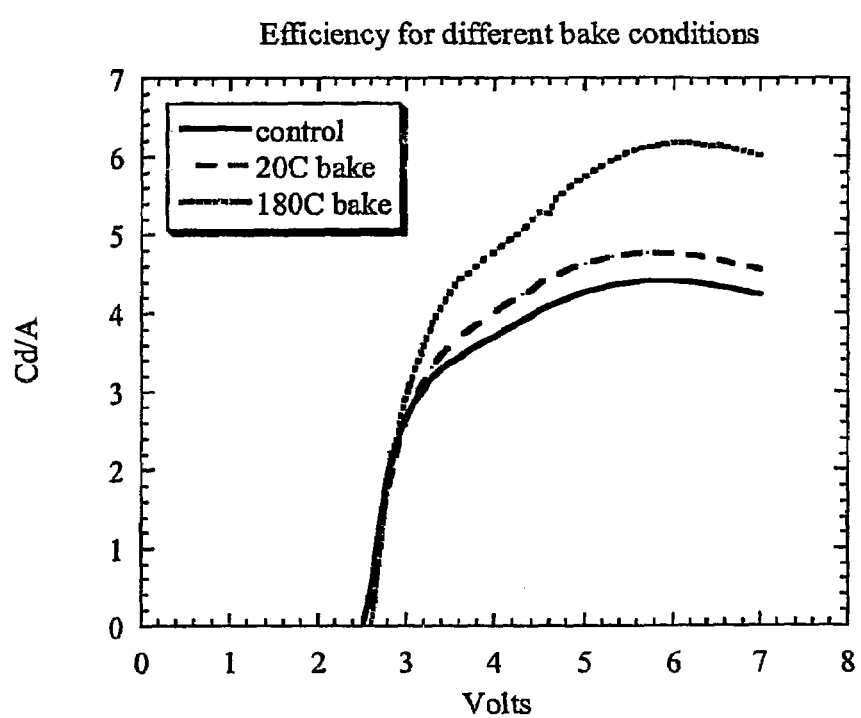
FIG. 2 shows a comparative plot of efficiency vs. bias for a first blue electroluminescent device and two control devices.

FIG. 2 shows the effect on efficiency of heat treatment in accordance with the invention. Three devices were compared: the device of example 1 (wherein the F8-TFB first layer is heated to 180° C.); a first control device wherein the first layer of F8-TFB is not provided (i.e. omission of steps 2-4); and a second control device having a first layer of F8-TFB which was not subjected to heating step 3. As can be seen by comparison of results for the first and second control devices, inclusion of a layer of F8-TFB results in improvement in efficiency (as reported in WO 99/48160), however the most significant improvement derives from the device according to the invention, i.e. the device wherein the F8-TFB layer is heated.

Example 2

The procedure of example 1 was followed except that a red electroluminescent polymer comprising 3% 4,7-bis(2-thiophene-5-yl)-2,1,3-benzothiadiazole repeat units (disclosed in WO 01/49768), 80% 9,9-dioctylfluorene-2,7-diyl, 30% 2,1,3-benzothiadiazole-4,7-diyl repeat units and 17% TFB repeat units, was used as the second semiconducting polymer (hereinafter referred to as "the Red Polymer").

Figure 3:
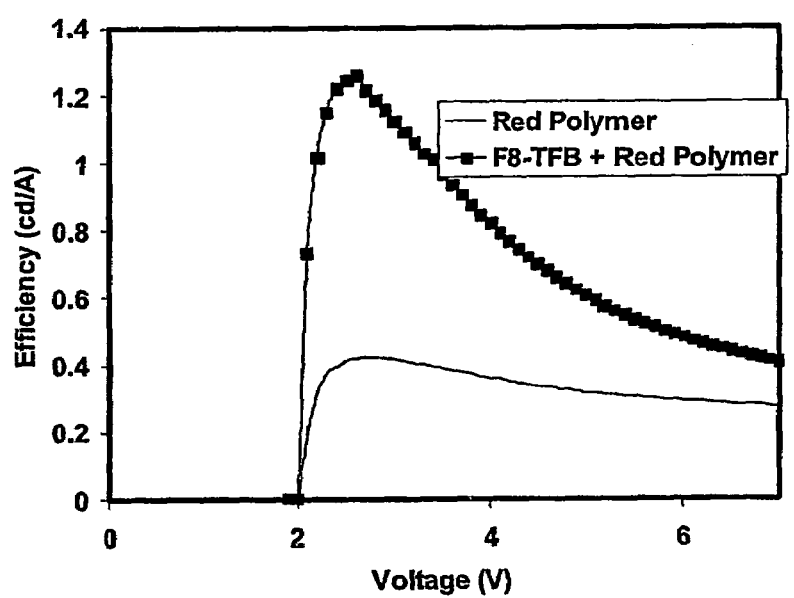
FIG. 3 shows a plot of efficiency vs. bias for a red electroluminescent device.

FIG. 3 shows a plot of efficiency vs. bias for this device and comparison with a control device comprising the Red Polymer wherein the insoluble layer of F8-TFB is not provided (i.e. omission of steps 2-4).

Example 3

The general procedure above was followed using poly(9-vinylcarbazole) (PVK) as the first semiconducting polymer (Aldrich catalogue number 18260-5; Average Mw c.a. 1,100,000) and the blue emissive polymer poly (9,9-dihexylfluorenyl-2,7-diyl) (PFO) purchased from American Dye Source, Inc (catalog number ADS130BE; average Mw ca. 300,000).

The layer of PVK was heated at 200° C. for 1 hour prior to deposition of the layer of PFO.

Figure 5:
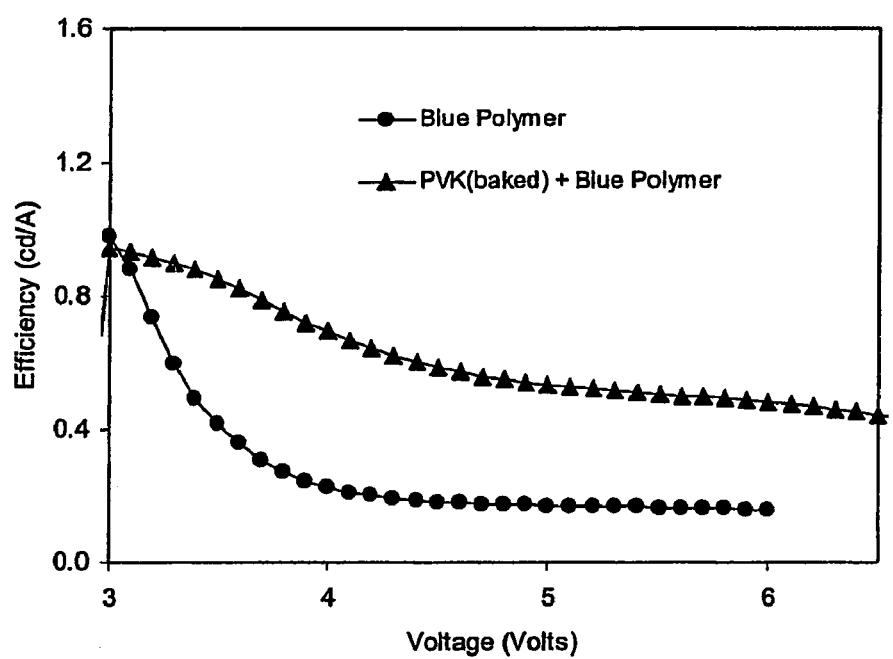
FIG. 5 shows a comparative plot of efficiency vs bias for a second blue electroluminescent device and a control device.

FIG. 5 shows that, compared to a control device not having a layer of PVK, efficiency is improved when the intermediate PVK layer is heat treated or subjected to ambient drying treatment.

As can be seen from the referenced figures, inclusion of an insoluble layer according to the invention results in a substantial increase in device performance. Furthermore, lifetime (i.e. the time taken for the brightness of the device to decay to half its original brightness at a fixed current) and brightness of the device were at least not compromised, and in some instances improved, by inclusion of an insoluble layer.

The insoluble layer is formed with or without heating of the F8-TFB layer, however the thickness of the insoluble layer is greater when the F8-TFB layer is heated.

Figure 4:
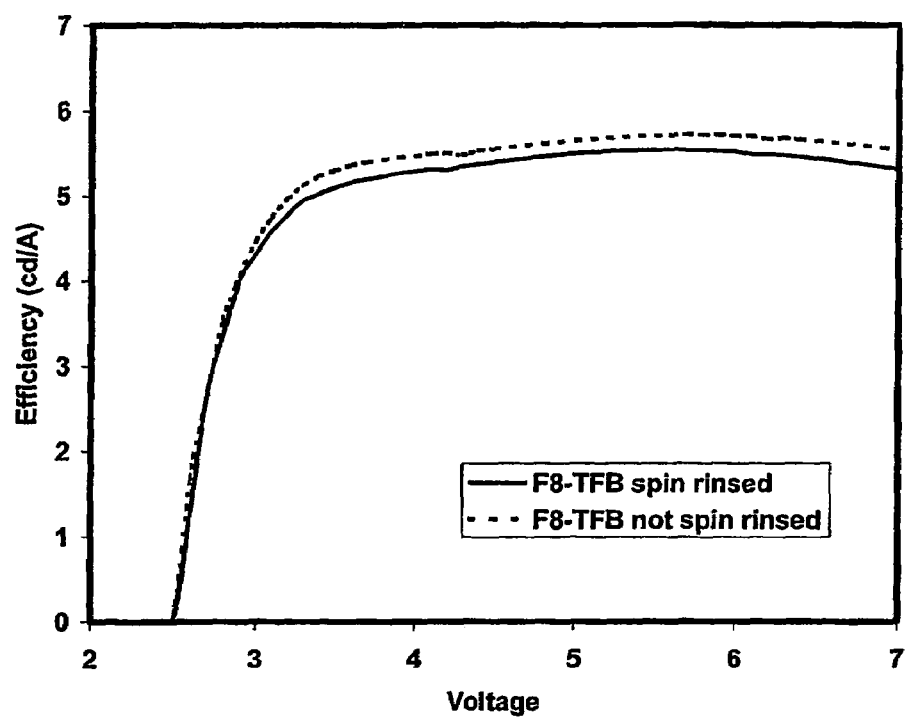
FIG. 4 shows a plot of efficiency vs. bias for a first blue electroluminescent device, with and without spin rinsing.

The second semiconducting polymer may be deposited without spin-rinsing of the first layer. This is preferably done where the first semiconducting polymer is deposited by spin-coating from dilute solution to form a first layer that is sufficiently thin for it to be rendered insoluble in its entirety, however the invention also encompasses deposition of the second semiconducting polymer wherein the first layer has been rendered only partially insoluble and the soluble portion has not been removed. In this instance there will be some blending in the second layer of the first and second semiconducting polymers. FIG. 4 shows efficiency vs. bias for two devices prepared according to the method of the invention using the Blue Polymer wherein one device is spin-rinsed and the other one is not. This figure shows that omission of the spin rinsing step has very little effect on device performance.

The examples above describe deposition of the first and second layers by spin-coating, however first and second layers according to the invention may be deposited by other techniques, in particular techniques suitable for making full colour displays such as inkjet printing as disclosed in EP 0880303, laser transfer as described in EP 0851714, flexographic printing, screen printing and doctor blade coating. In the case where the second semiconducting material is deposited by inkjet printing, the use of a spin-rinsing step may be more advantageous than for a corresponding spin-coating deposition because of the smaller volume of solvent and semiconducting material involved in inkjet printing.

Application Example

Downconverter particles were attached to the outer surface of the substrate of the device of Example 1 (Blue Polymer) as described in Applied Physics Letters 80(19), 3470-3472, 2002 to provide a device capable of emitting white light.

Although the present invention has been described in terms of specific exemplary embodiments, it will be appreciated that various modifications, alterations and/or combinations of features disclosed herein will be apparent to those skilled in the art without departing from the spirit and scope of the invention as set forth in the following claims.

The invention claimed is:

1. A method of forming an optical device comprising the steps of: providing a substrate comprising a first electrode capable of injecting or accepting charge carriers of a first type;

forming over the first electrode a first layer that is at least partially insoluble in a solvent by depositing a first semiconducting material that is free of cross-linkable vinyl or ethynyl groups and is, at the time of deposition, soluble in the solvent;

forming a second layer in contact with the first layer by depositing a second semiconducting material from a solution in the solvent;

forming over the second layer a second electrode capable of injecting or accepting charge carriers of a second type; and subjecting the first layer to one or more of heat treatment, vacuum treatment and ambient drying treatment in order to render the first layer at least partially insoluble wherein at least one of the first and second semiconducting materials is a polyfluorene comprising optionally substituted repeat units of formula (I):

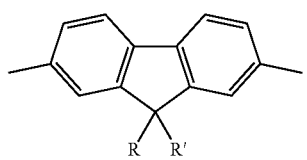

(I)

wherein R and R' are selected from hydrogen or optionally substituted alkyl, alkoxy, aryl, arylalkyl, heteroaryl and heteroarylalkyl, and at least one of R and R' comprises an optionally substituted $C_4$-$C_{20}$ alkyl group.

2. A method according to claim 1 comprising the step of heating the first layer prior to deposition of the second layer.

3. A method according to claim 1 comprising washing the first layer with a washing solvent in which the first semiconducting material is soluble prior to forming the second layer.

4. A method according to claim 1 wherein the first layer is deposited from a solution in the solvent.

5. A method according to claim 1 wherein the first semiconducting material is a polymer comprising a 1:1 regular, alternating copolymer of a fluorene repeat unit of formula (I):

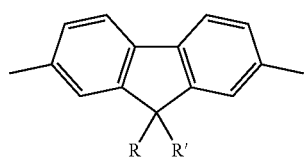

(I)

wherein R and R' are independently selected from hydrogen or optionally substituted alkyl, alkoxy, aryl, arylalkyl, heteroaryl and heteroarylalkyl, and at least one of R and R' is not hydrogen and a triarylamine repeat unit.

6. A method according to claim 1 wherein the first layer has a thickness of less than 20 nm.

7. A method according to claim 6 wherein the first layer has a thickness less than 10 nm.

8. A method of forming an optical device comprising the steps of: providing a substrate comprising a first electrode capable of injecting or accepting charge carriers of a first type;

forming over the first electrode a first layer that is at least partially insoluble in a solvent by depositing a first semiconducting material that is free of cross-linkable vinyl or ethynyl groups and is, at the time of deposition, soluble in the solvent;

forming a second layer in contact with the first layer by depositing a second semiconducting material from a solution in the solvent;

forming over the second layer a second electrode capable of injecting or accepting charge carriers of a second type; and subjecting the first layer to one or more of heat treatment, vacuum treatment and ambient drying treatment in order to render the first layer at least partially insoluble wherein the solvent is an aromatic hydrocarbon.

9. A method according to claim 8 wherein the solvent is an alkylated benzene.

10. A method according to claim 9 wherein the solvent is toluene or xylene.

11. A method of forming an optical device comprising the steps of: providing a substrate comprising a first electrode capable of injecting or accepting charge carriers of a first type;

forming over the first electrode a first layer that is at least partially insoluble in a solvent by depositing a first semiconducting material that is free of cross-linkable vinyl or ethynyl groups and is, at the time of deposition, soluble in the solvent;

forming a second layer in contact with the first layer by depositing a second semiconducting material from a solution in the solvent;

forming over the second layer a second electrode capable of injecting or accepting charge carriers of a second type; and subjecting the first layer to one or more of heat treatment, vacuum treatment and ambient drying treatment in order to render the first layer at least partially insoluble, wherein the first electrode is capable of injecting holes and the second electrode is capable of injecting electrons, and the first semiconducting material is a polymer comprising triarylamine repeat units.

12. A method according to claim 11 wherein the triarylamine repeat units are selected from optionally substituted repeat units of formulae 1-6:

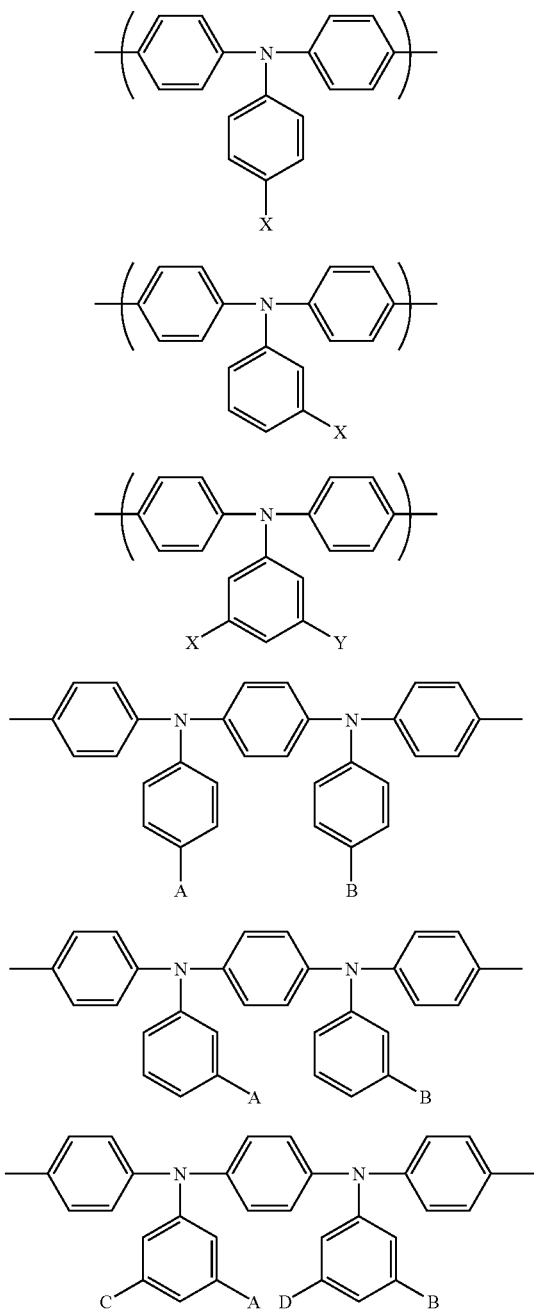

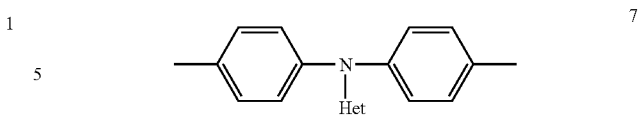

wherein Het is a heteroaryl.

15. A method according to claim 14 wherein Het is 4-pyridyl.

16. A method of forming an optical device comprising the steps of: providing a substrate comprising a first electrode capable of injecting or accepting charge carriers of a first type;
forming over the first electrode a first layer that is at least partially insoluble in a solvent by depositing a first semiconducting material that is free of cross-linkable vinyl or ethynyl groups and is, at the time of deposition, soluble in the solvent;
forming a second layer in contact with the first layer by depositing a second semiconducting material from a solution in the solvent;
forming over the second layer a second electrode capable of injecting or accepting charge carriers of a second type; and
subjecting the first layer to one or more of heat treatment, vacuum treatment and ambient drying treatment in order to render the first layer at least partially insoluble, and further comprising providing a layer of conductive organic material between the first electrode and the first layer, wherein the first electrode is capable of injecting holes and the second electrode is capable of injecting electrons.

17. A method according to claim 16 wherein the layer of conductive organic material is PEDT/PSS.

18. A method of forming an optical device comprising the steps of: providing a substrate comprising a first electrode capable of injecting or accepting charge carriers of a first type;
forming over the first electrode a first layer that is at least partially insoluble in a solvent by depositing a first semiconducting material that is free of cross-linkable vinyl or ethynyl groups and is, at the time of deposition, soluble in the solvent;
forming a second layer in contact with the first layer by depositing a second semiconducting material from a solution in the solvent;
forming over the second layer a second electrode capable of injecting or accepting charge carriers of a second type; and
subjecting the first layer to one or more of heat treatment, vacuum treatment and ambient drying treatment in order to render the first layer at least partially insoluble wherein the second semiconducting material is a polymer comprising a plurality of regions including at least two regions selected from the group consisting of a hole transporting region, an electron transporting region and an emissive region.

wherein X, Y, A, B, C and D are independently selected from H or a substituent group.

13. A method according to claim 12 wherein one or more of X, Y, A, B, C and D is independently selected from the group consisting of alkyl, aryl, perfluoroalkyl, thioalkyl, cyano, alkoxy, heteroaryl, alkylaryl and arylalkyl groups.

14. A method according to claim 11 wherein the triarylamine repeat unit is an optionally substituted repeat unit of formula 7:

19. A method according to claim 18 wherein the second semiconducting material comprises a hole transporting region, an electron transporting region and an emissive region.

* * * * *

UNITED STATES PATENT AND TRADEMARK OFFICE
CERTIFICATE OF CORRECTION

| | | |
|---|---|---|
| PATENT NO. | : 7,531,377 B2 | Page 1 of 1 |
| APPLICATION NO. | : 10/526804 | |
| DATED | : May 12, 2009 | |
| INVENTOR(S) | : Craig E. Murphy et al. | |

It is certified that error appears in the above-identified patent and that said Letters Patent is hereby corrected as shown below:

On the Cover Page:

At field (73), add as a second Assignee -- General Electric Company, Schenectady, NY (US) --

Signed and Sealed this

Eighth Day of June, 2010

David J. Kappos
*Director of the United States Patent and Trademark Office*